(12) United States Patent
Yaung et al.

(10) Patent No.: US 6,323,054 B1
(45) Date of Patent: Nov. 27, 2001

(54) LATERAL P-I-N PHOTODIODE ELEMENT WITH HIGH QUANTUM EFFICIENCY FOR A CMOS IMAGE SENSOR

(75) Inventors: Dun-Nian Yaung, Taipei; Shou-Gwo Wuu, Hsin-Chu; Chien-Hsien Tseng, Hsinchu; Ching-Chun Wang, Kaohsiung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/583,398

(22) Filed: May 31, 2000

(51) Int. Cl.[7] .................................................. H01L 21/00
(52) U.S. Cl. .................. 438/75; 438/48; 438/57
(58) Field of Search .................... 438/48, 57, 75

(56) References Cited

U.S. PATENT DOCUMENTS

| | | | |
|---|---|---|---|
| 4,128,843 | * 12/1978 | Chiang | 357/30 |
| 4,205,333 | * 5/1980 | Yamamoto | 357/35 |
| 4,972,244 | * 11/1990 | Buffet et al. | 357/30 |
| 4,974,061 | * 11/1990 | Torkai et al. | 357/30 |
| 5,043,785 | 8/1991 | Mizutani et al. | 357/30 |
| 5,446,297 | * 8/1995 | Lee | 257/223 |
| 5,476,808 | 12/1995 | Kusaka et al. | 437/53 |
| 5,519,247 | * 5/1996 | Arbus et al. | 257/437 |
| 5,648,292 | 7/1997 | Moon | 437/53 |
| 5,723,354 | 3/1998 | Park et al. | 437/53 |
| 5,880,495 | 3/1999 | Chen | 257/233 |
| 5,886,374 | * 3/1999 | Sakamoto et al. | 257/292 |
| 6,040,592 | * 3/2000 | McDaniel et al. | 257/292 |

* cited by examiner

Primary Examiner—John F. Niebling
Assistant Examiner—Christopher Lattin
(74) Attorney, Agent, or Firm—George O. Saile; Stephen B. Ackerman

(57) ABSTRACT

A process for fabricating a lateral photodiode element, for an image sensor cell, with an increased depletion region, has been developed. The process features protecting a portion of the semiconductor substrate from ion implantation procedures used to create the P well, and the N well components of the lateral photodiode element. The protected region, or the space between the P well and N well regions, allows a larger depletion region to be realized, when compared to lateral photodiode elements in which the N well and P well regions butt. The space between the P well and N well regions, between about 0.2 to 0.4 um, result in the desired P well—intrinsic or P type semiconductor substrate—N well, (P-I-N), lateral photodiode element.

10 Claims, 3 Drawing Sheets

LATERAL P-I-N PHOTODIODE ELEMENT WITH HIGH QUANTUM EFFICIENCY FOR A CMOS IMAGE SENSOR

BACKGROUND OF THE INVENTION (1) Field of the Invention

The present invention relates to methods used to fabricate semiconductor devices, and more specifically to a method used to fabricate a lateral N/P photodiode element for an image sensor cell.

(2) Description of Prior Art

Active pixel, or image sensor cells, are usually comprised with a photodiode element, used to collect photon energy for the cell. The efficiency, or sensitivity of the photon collector, or the photodiode element, usually comprised of a N/P diode, is directly related to the depletion region of this diode. The depletion region in turn is a function of the doping level of the components of the N/P photodiode element, as well as a function of the area of the photodiode. However trends to micro-miniaturization have resulted in decreasing space allotted for the image censor cell, and thus smaller area, less efficient photodiode elements have to used.

This invention will describe a novel method for fabricating a CMOS image sensor device, using a process sequence that can be simultaneously used to form other CMOS devices, used for logic and memory applications. This invention however will feature the formation of a lateral N/P photodiode element, exhibiting an increased depletion region, when compared to other lateral N/P photodiodes, fabricated without the use of the processes described in this invention. Prior art, such as Chen, in U.S. Pat No. 5,880,495, describes a method of fabricating a photodiode element for an image sensor cell, however that prior art does not teach the process needed to fabricate the lateral N/P photodiode element, described in this present invention, in which an increased depletion region, and thus increased photosensitivity, is realized via the placement of a lightly doped, or of an intrinsic region, at the interface between the N type, and P type regions of the lateral N/P photodiode element.

SUMMARY OF THE INVENTION

It is an object of this invention to fabricate an image sensor cell featuring a lateral N/P photodiode element.

It is another object of this invention to use the P well, and the N well regions, used for the simultaneously fabricated CMOS devices, as the components of the lateral N/P photodiode element of the image sensor cell.

It is still another object of this invention to form a lightly doped, or an intrinsic region, between the P well and N well components of the lateral N/P photodiode element, to increase the depletion region, and thus the photosensitivity of the lateral N/P photodiode element.

In accordance with the present invention a method of fabricating a lateral, P well—intrinsic—N well, (P-I-N), photodiode element, for an image sensor cell, featuring a lightly doped, or intrinsic region, located between the P well and N well components of the lateral photodiode element, is described. After forming shallow trench isolation regions in a P type semiconductor substrate, P well regions are formed for reset and transfer gate transistors, as well as for the P type component of the subsequent lateral P/N photodiode element. The N well, or N type component of the lateral N/P photodiode element is next formed, however placed between about 0.2 to 0.4 um, away from the adjacent P well region, resulting in a lateral P-I-N, photodiode element, in which I, of the P-I-N photodiode element, refers to the region between the P well and N well regions. This intentionally formed I region, or space between the P well and N well regions, allows an increase in the depletion region of the photodiode element to be realized.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
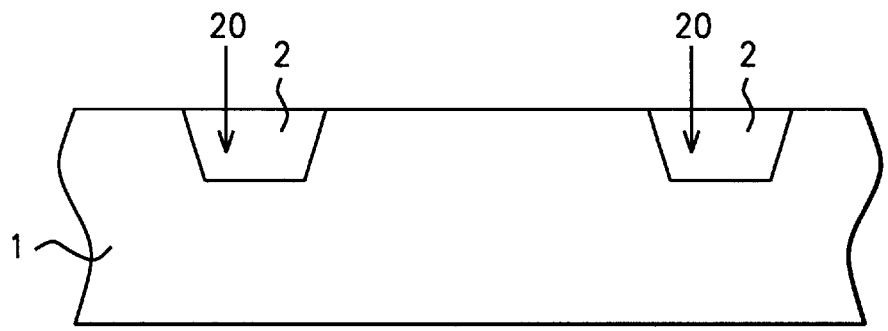
FIGS. 1, 2, 3B, and 4, which schematically, in cross-sectional style, show key stages of fabrication used to create the lateral P-I-N photodiode element, of an image sensor coil.

The method of fabricating a lateral, P-I-N photodiode element, for an image sensor cell, will now be described in detail. A P type, semiconductor substrate 1, comprised of single crystalline silicon, with a <100> crystallographic orientation, is used and shown schematically in FIG. 1 . The resistivity of P type semiconductor substrate 1, is between about 8 to 12 ohm-cm. The dopant concentration of the substrate is critical in determining the extent of a subsequent depletion region formed between the N well, and P type substrate components of the lateral P-I-N photodiode element. Shallow trench isolation, (ST!), regions 2, also shown schematically in FIG. 1, are formed in regions of semiconductor substrate 1. This is accomplished via conventional photolithographic and reactive ion etching, (RIE), procedures, first using $CF_4$ as an etchant for a composite insulator mask, (not shown in drawings), comprised of an overlying silicon nitride layer, and an underling silicon oxide layer, then using $Cl_2$ or $SF_6$, as an etchant to define shallow trench openings 20, between about 3000 to 4000 Angstroms in depth, in semiconductor substrate 1. After removal of the photoresist shape, used to define the shallow trench shape, a silicon oxide layer is deposited, via low pressure chemical vapor deposition, (LPCVD), or via plasma enhanced chemical vapor deposition, (PECVD), procedures, completely filling shallow trench shapes 20. A chemical mechanical polishing, (CMP), procedure is next employed to remove the portions of the silicon oxide layer from the top surface of the composite insulator layer, resulting in insulator filled, STI shapes 2, schematically shown in FIG. 1. The composite insulator layer can then be selectively removed via wet, or dry etching procedures.

Figure 2:
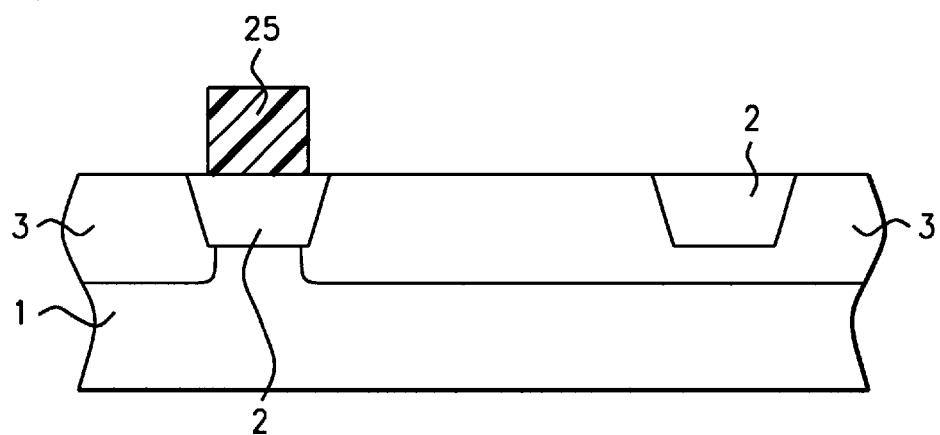

Photoresist shape 25, is next formed and used as a mask to allow an ion implantation procedure to create P well regions 3, in unprotected regions of semiconductor substrate 1. This is schematically shown in FIG. 2. The implantation procedure is performed using boron ions, at an energy between about 150 to 200 KeV, at a dose between about 5E12 to 1E13 atoms/$cm^2$. The P type dopant concentration of P well region 2, is greater than the P type dopant concentration in semiconductor substrate 1.

Figure 3A:
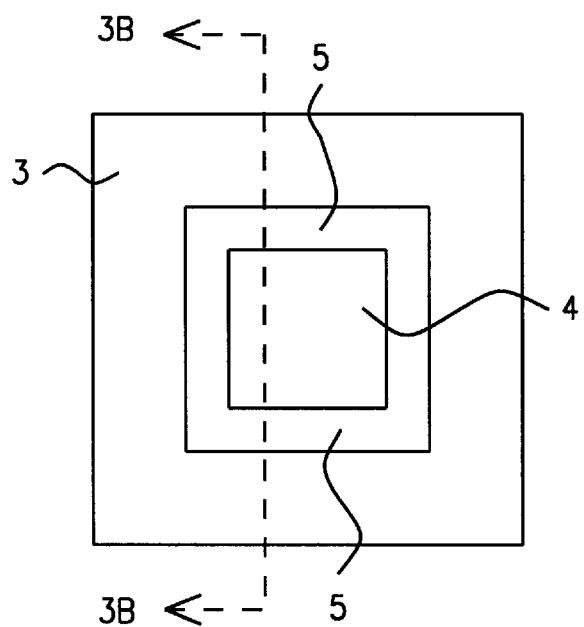
FIG. 3A, which schematically show a top view of the lateral P-I-N photodiode element, at a specific stage of fabrication.
Figure 3B:
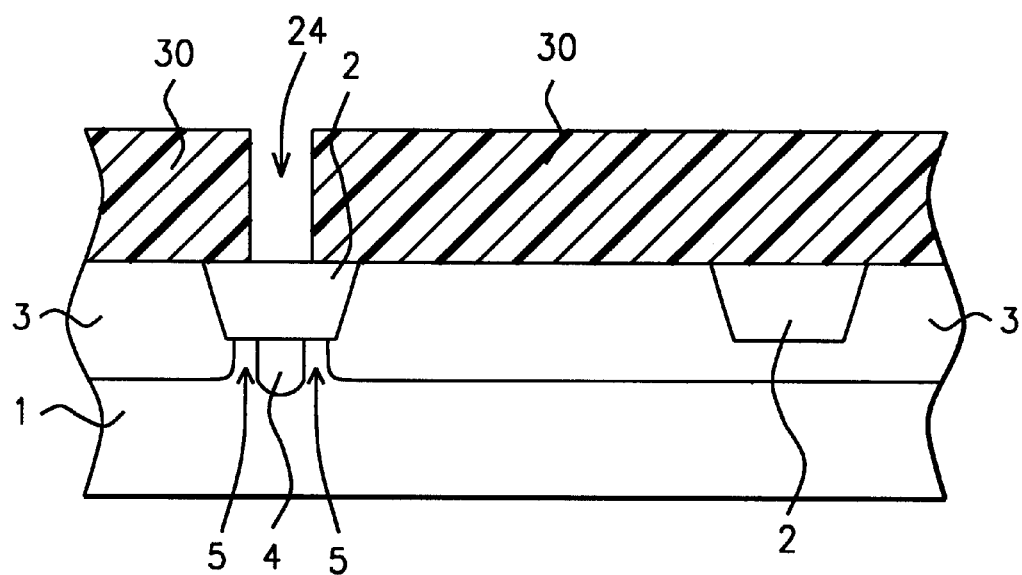

After removal of photoresist shape 25, used to define P well regions 3, via plasma oxygen ashing and careful wet cleans, photoresist shape 30, featuring opening 24, is formed, allowing N well region 4, to be formed in an unprotected region of semiconductor substrate 1, located between P well regions 3. N well region 4, is formed via implantation of phosphorous ions, at an energy between about 400 to 500 KeV, at a dose between about 5E12 to 1E13 atoms/cm$^2$. A critical feature of N well region 4, is the placement of this region between P well regions 3, with space 5, located between P well region 3, and N well region 4, at a width between about 0.2 to 0.4 um. This is shown in cross-sectional style in FIG. 3B, and schematically as a top view, in FIG. 3A. Space 5, comprised of P type semiconductor substrate 1, will allow the depletion region formed from N well region 5, and P type semiconductor substrate 1, to be greater than a depletion region that would have been formed if N well region 5, butted P well region 3, or if space 5, were not designed into the lateral photodiode element. The increased depletion region will offer increased photosensitivity, or higher quantum efficiency, for the image sensor cell. Opening 24, in photoresist shape 30, was designed using a dimension that would account for any photo misalignment, however still allowing space 5, to be realized. Photoresist shape 30, is then removed via plasma oxygen ashing and careful wet cleans.

Figure 4:
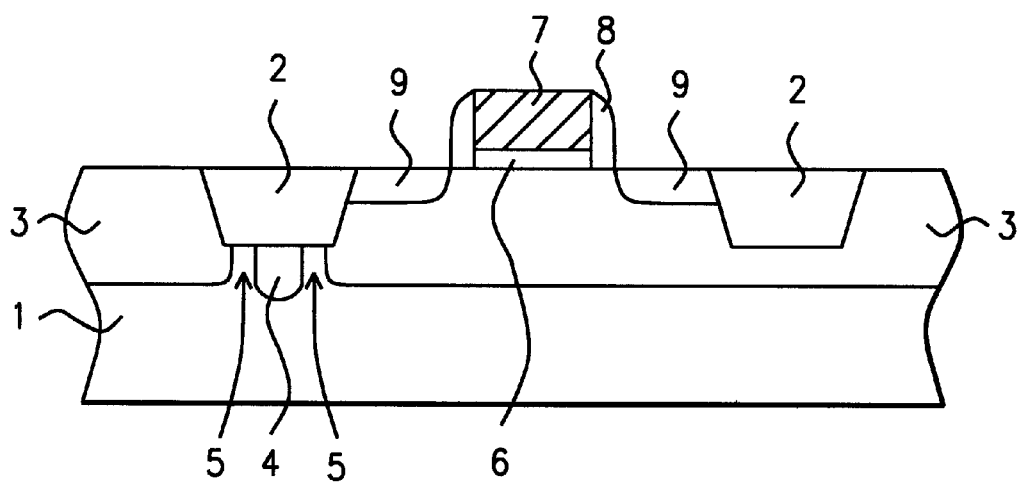

The fabrication of a transfer gate transistor, used for the reset transistor of the image sensor cell, is next addressed, and shown schematically in FIG. 4. A gate insulator layer 6, comprised of silicon dioxide, is thermally grown at a thickness between about 20 to 80 Angstroms, followed by the formation of gate structure 7, comprised of polysilicon, Gate structure 7, is formed via deposition of a polysilicon layer, via LPCVD procedures, at a thickness between about 1000 to 2000 Angstrom. The polysilicon layer can be doped in situ, during deposition, via the addition of amine, or phosphine, to a silane ambient, or the polysilicon layer can be deposited intrinsically then doped via implantation of arsenic or phosphorous ions. Conventional photolithographic and anisotropic RIE procedures, using $Cl_2$ as an etchant, are used to define gate structure 7. Isolator spacers 8, comprised of silicon oxide, or silicon nitride, are formed on the sides of gate structure 7, via deposition of a silicon oxide, or silicon nitride layer, at a thickness between about 1000 to 2000 Angstroms, via LPCVD or PECVD procedures, followed by an anisotropic RIE procedure, using $CHF_3$ or $CF_4$ as an etchant. A photoresist shape, (not shown in the drawings), is then used to block out the lateral photodiode region, allowing implantation of arsenic or phosphorous ions, to create heavily doped sourceldrain region 9. The photoresist shape, used to protect the lateral photodiode region, during the heavily doped source/drain ion implantation procedure, is removed again using plasma oxygen ashing and careful wet cleans.

Figure 5:
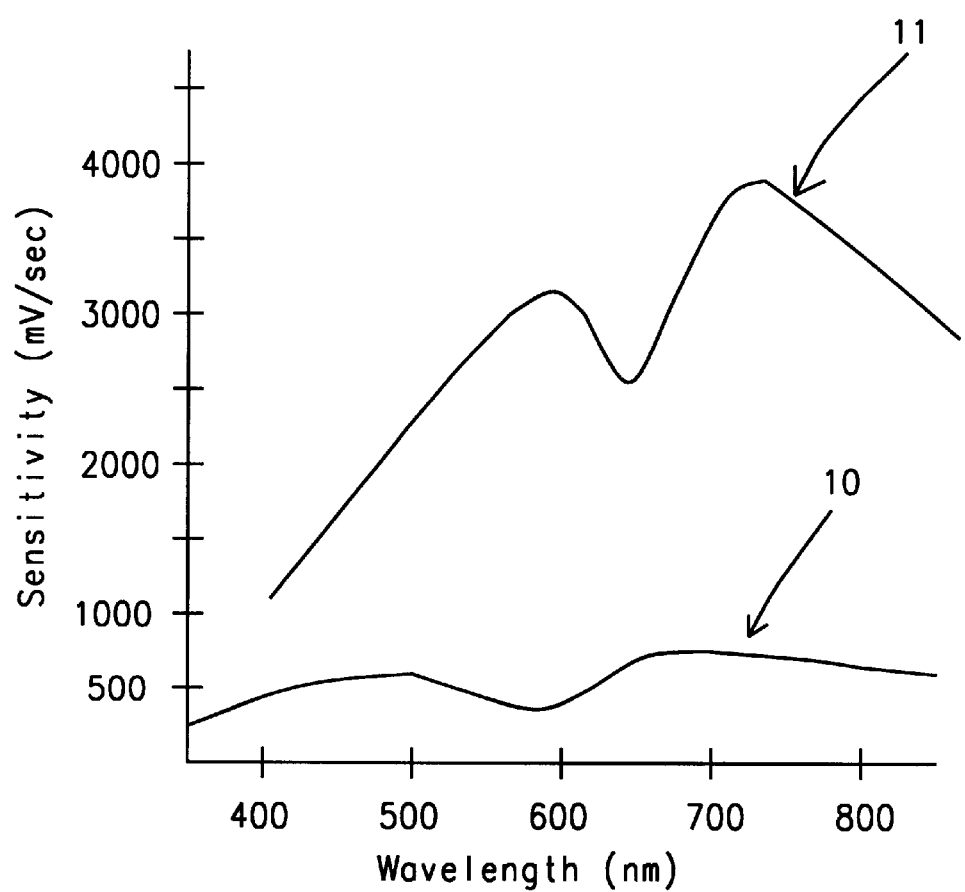
FIG. 5, which graphically compares the increased photosensitivity of an image sensor cell, fabricated using the lateral P-I-N photodiode described in this invention, versus the photosensitivity of a counterpart image sensor cell, fabricated without the lateral P-I-N photodiode element.

The benefit, in terms of photosensitivity for the lateral P-I-N photodiode element, is shown graphically in FIG. 5. The photosensitivity, or quantum efficiency of image sensor cell 11, formed using the lateral P-I-N photodiode element, described in this invention, is greater at all wavelength values than counterpart image sensor cell 12, fabricated with the N well region butting the P well region. The ability to form the depletion region from an N well; region and the P type substrate, featured in the lateral P-I-N photodiode element of this invention, rather than from an N well region, directly butting a P well region, allowed the desired increase in quantum efficiency to be realized.

While this invention has been particularly shown and described with reference to, the preferred embodiments thereof, it will be understood by those skilled in the art that various changes in form and details may be made without departing from the spirit or scope of this invention.

What is claimed is:

1. A method of forming a lateral photodiode element for an image sensor cell, in a semiconductor substrate, comprising the steps of:

forming an insulator shape in a first region of said semiconductor substrate, with said insulator shape directly overlying a second region of said semiconductor substrate;

forming a P well region, in a third region of said semiconductor substrate, with said third region of said semiconductor substrate a region not occupied with said insulator shape, and with said P well region butting said second region of said semiconductor substrate;

forming a photoresist shape on a top surface of said semiconductor substrate with an opening in said photoresist shape exposing a portion of a top surface of said insulator shape; and performing an ion implantation procedure through a portion of said insulator shape exposed in said opening in said photoresist shape, forming an N well region in a first portion of said second region of said semiconductor substrate, while second portions of said second region of said semiconductor substrate, directly underlying portions of said insulator shape not exposed in said opening in said photoresist shape, are protected from said ion implantation procedure, remain as intrinsic spaces resulting in said photodiode element.

2. The method of claim 1, wherein said semiconductor substrate is a P type semiconductor substrate, comprised with a resistivity between 8 to 12 ohm-cm.

3. The method of claim 1, wherein said P well region, formed in said third region of said semiconductor substrate, is formed via ion implantation of boron ions, at an energy between 150 to 200 KeV, at a dose between 5E12 to 1E13 atoms/cm$^2$.

4. The method of claim 1, wherein said N well region, formed in said first portion of said second region of said semiconductor substrate, is formed via said ion implantation procedure using phosphorous ions, at an energy between 400 to 500 KeV, at a dose between 5E12 to 1E13 atoms/cm$^2$.

5. The method of claim 1, wherein said intrinsic spaces located in said second portions of said second region of said semiconductor substrate, are comprised with a width between 0.20 to 0.40 um.

6. A method of fabricating a lateral photodiode element, for an image sensor cell, on a semiconductor substrate, featuring intrinsic portions of said semiconductor substrate, intentionally placed between a P well region, and an N well region, of said lateral photodiode element, comprising the steps of:

providing a semiconductor substrate, comprised with a first P type dopant concentration, with said first P type dopant concentration at a level low enough to be referred to as an intrinsically doped semiconductor substrate;

forming a shallow trench insulator (STI), shape, in a first region of said semiconductor substrate, with a second region of said semiconductor substrate now located directly underlying said STI shape;

performing a first ion implantation procedure to form said P well region in a third region of said semiconductor substrate, with said third region of said semiconductor substrate a region of said semiconductor substrate not occupied by said STI shape, and with said P well region comprised with a second P type dopant concentration, and with the P type dopant concentration of said P well region, greater in P type dopant, than the P type dopant concentration of said semiconductor substrate;

forming a photoresist shape on a top surface of said semconductor substrate, and on a top surface of STI shape, with an opening in said photoresist shape exposing a portion of said top surface of said STI shape; and performing a high energy, second ion implantation procedure through a portion of STI shape exposed in said opening in said photoresist shape, to form said N well region in a first portion of said second region of said semiconductor substrate, with remaining second portions of said second region of said semiconductor substrate, not subjected to said high energy, second ion implantation procedure, remaining as said intrinsic spaces located in second portions of said second region of said semiconductor substrate, resulting in said lateral photodiode element, comprised of said P well region, and said N well region, separated by said intrinsic spaces.

7. The method of claim 6, wherein said semiconductor substrate is comprised with a resistivity between 8 to 12 ohm-cm.

8. The method of claim 6, wherein said first ion implantation procedure, used to form said P well region, is performed using boron ions, at an energy between 150 to 200 KeV, at a dose between 5E12 to 1E13 atoms/cm$^2$.

9. The method of claim 6, wherein said high energy, second ion implantation procedure, used to form said N well region, is performed using phosphorous ions, at an energy between 400 to 500 KeV, at a dose between 5E12 to 1E13 atoms/cm$^2$.

10. The method of claim 6, wherein the width of said intrinsic spaces, located in said second portions of said second region of said semiconductor substrate, are between 0.2 to 0.4 um.

* * * * *